(12) United States Patent
Hu et al.

(10) Patent No.: US 8,609,205 B2
(45) Date of Patent: Dec. 17, 2013

(54) METHOD FOR DEPOSITING CRYSTALLINE TITANIA NANOPARTICLES AND FILMS

(75) Inventors: Zhendong Hu, Ann Arbor, MI (US); Yong Che, Ann Arbor, MI (US); Bing Liu, Ann Arbor, MI (US)

(73) Assignee: Imra America, Inc., Ann Arbor, MI (US)

(*) Notice: Subject to any disclaimer, the term of this patent is extended or adjusted under 35 U.S.C. 154(b) by 0 days.

(21) Appl. No.: 12/497,205

(22) Filed: Jul. 2, 2009

(65) Prior Publication Data

US 2009/0311513 A1 Dec. 17, 2009

Related U.S. Application Data

(63) Continuation of application No. PCT/US2008/052544, filed on Jan. 31, 2008, which is a continuation of application No. 11/798,114, filed on May 10, 2007, now abandoned.

(60) Provisional application No. 60/899,892, filed on Feb. 7, 2007.

(51) Int. Cl.
*H05B 7/00* (2006.01)
*C23C 14/14* (2006.01)

(52) U.S. Cl.
USPC .......................................................... 427/596

(58) Field of Classification Search
USPC .................................................. 427/596, 509
See application file for complete search history.

(56) References Cited

U.S. PATENT DOCUMENTS

| | | | |
|---|---|---|---|
| 4,585,799 A | 4/1986 | Morris | |
| 4,932,747 A | 6/1990 | Russell et al. | |
| 5,338,625 A | 8/1994 | Bates et al. | |
| 5,432,151 A | 7/1995 | Russo et al. | |
| 5,490,912 A | 2/1996 | Warner et al. | |
| 5,656,186 A | 8/1997 | Mourou et al. | |
| 6,312,768 B1 | 11/2001 | Rode et al. | |
| RE37,585 E | 3/2002 | Mourou et al. | |
| 6,372,103 B1 | 4/2002 | Perry et al. | |

(Continued)

FOREIGN PATENT DOCUMENTS

EP 1 308 418 A1 5/2003
EP 1881085 A2 1/2008

(Continued)

OTHER PUBLICATIONS

Fu et al (Science in China B, vol. 42, No. 5, pp. 493-500).*

(Continued)

*Primary Examiner* — Michael Cleveland
*Assistant Examiner* — Joel Horning
(74) *Attorney, Agent, or Firm* — Sughrue Mion, PLLC

(57) ABSTRACT

A one-step and room-temperature process for depositing nanoparticles or nanocomposite (nanoparticle-assembled) films of metal oxides such as crystalline titanium dioxide ($TiO_2$) onto a substrate surface using ultrafast pulsed laser ablation of Titania or metal titanium target. The system includes a pulsed laser with a pulse duration ranging from a few femtoseconds to a few tens of picoseconds, an optical setup for processing the laser beam such that the beam is focused onto the target surface with an appropriate average energy density and an appropriate energy density distribution, and a vacuum chamber in which the target and the substrate are installed and background gases and their pressures are appropriately adjusted.

23 Claims, 11 Drawing Sheets

(56) References Cited

U.S. PATENT DOCUMENTS

| | | |
|---|---|---|
| 6,423,411 B2 | 7/2002 | Balkus, Jr. et al. |
| 6,645,656 B1 | 11/2003 | Chen et al. |
| 6,689,504 B1 | 2/2004 | Matsumoto et al. |
| 7,026,694 B2 | 4/2006 | Ahn et al. |
| 7,135,206 B2 | 11/2006 | Schichtel |
| 7,589,128 B2 | 9/2009 | Szabo |
| 7,604,794 B2 | 10/2009 | Tiitta et al. |
| 7,781,585 B2 | 8/2010 | Satyanarayana |
| 8,119,662 B2 | 2/2012 | Gore et al. |
| 2002/0001746 A1 | 1/2002 | Jenson |
| 2002/0172820 A1 | 11/2002 | Majumdar et al. |
| 2003/0160589 A1 | 8/2003 | Krasnov et al. |
| 2004/0131537 A1 | 7/2004 | Yang et al. |
| 2004/0180220 A1 | 9/2004 | Gueneau et al. |
| 2004/0247796 A1 | 12/2004 | Hanley et al. |
| 2004/0265590 A1 | 12/2004 | Schichtel |
| 2005/0034668 A1 | 2/2005 | Garvey et al. |
| 2005/0218122 A1 | 10/2005 | Yamamoto et al. |
| 2005/0226287 A1 | 10/2005 | Shah et al. |
| 2005/0276931 A1 | 12/2005 | Che et al. |
| 2006/0039419 A1 | 2/2006 | Deshi |
| 2006/0049034 A1 | 3/2006 | Lee et al. |
| 2006/0049547 A1 | 3/2006 | Khang |
| 2008/0006524 A1 | 1/2008 | Liu et al. |
| 2008/0187684 A1 | 8/2008 | Hu et al. |

FOREIGN PATENT DOCUMENTS

| | | |
|---|---|---|
| JP | 2002-020199 A | 1/2002 |
| JP | 2002-206164 A | 1/2002 |
| JP | 2002020199 A | 1/2002 |
| JP | 2002206164 A | 7/2002 |
| JP | 2003-306319 A | 10/2003 |
| JP | 2004-256859 A | 9/2004 |
| JP | 2004256859 A | 9/2004 |
| WO | 99/13127 A1 | 3/1999 |

OTHER PUBLICATIONS

Murakami et al, "Anatase TiO2 thin films Grown on Lattice Matched La-Al03 Substrate by laser Molecular-beam Epitaxy", applied Physics Letters vol. 78, No. 18, p. 2664 Apr. 30, 2001.

Fu et al, In-situ Photoelectrochemistry of PLD Nano-TiO$_2$ Film Electrode, Science in China (Series B), vol. 29, No. 6, pp. 546-552, Dec. 31, 1999.

English translation of an Official Action dated Mar. 1, 2010, in corresponding Chinese Patent Application No. 200580018628.3.

Response the Office Action dated Mar. 4, 2010, in corresponding Chinese Patent Application No. 200580018628.3.

C. Boulmer-Leborgne et al., 'Femtosecond laser beam in interaction with materials for thin film deposition', High-Power Laser Ablation VI, edited by Claude R. Phipps SPIE 6261-20, 2006.

X. Chen et al., 'Pulsed laser deposition of conducting porous La-Sr-Co-O films', Thin Solid Films 342 (1999) 61-66.

X. Chen et al., 'Structure and conducting properties of La0.5Sr0.5CoO3-d films on YSZ', Thin Solid Films, vol. 350, Issues 1-2, Aug. 15, 1999, pp. 130-137.

Domingiez et al., 'Epitaxial SnO2 thin films grown on (1012) sapphire by femtosecond pulsed laser deposition', J. of Applied Physics vol. 19, No. 3, Feb. 1, 2002, p. 1060-1065.

Gamaly et al., 'Electrostatic mechanism of ablation by femtosecond lasers', Applied Surface Science, 197-8, 699, 2002.

Garrelie et al., 'New trends in femtosecond pulsed laser deposition and femtosecond produced plasma diagnostics', High-Power Laser Ablaation VI, edited by Claude R. Phipps, Proc. SPIE 6261, 62610L (2006).

Hubler, G., 'Comparison of Vacuum Deposition Techniques' Pulsed Laser Deposition of Thin Films (D. Chrisey Editor), Chp. 13 pp. 327-355, John Wiley & Sons, Inc. (1994).

Perkins et al., 'Pulsed laser deposition and characterization of crystalline lithium cobalt dioxide, (LiCo02) thin films', J Electrochem Soc 148 (12): A1302-A1312 (2001).

Sarradin J., et al., 'Tin/Tin Oxide Film Electrodes for: Lithium-ion Batteries', Journal of Power Sources 97-98, (2001), 208.

Von der Linde et al., 'Laser-solid interaction in the femtosecond time regime', Applied Surface Science, 109/110, 1997, 1-10.

Zhao et al., 'Li-V-Si-O thin film electrolyte for all-solid-state Li-ion battery'. Journal of Power Sources 122 (2003) p. 174-180.

Zhao et al., 'A solid-state electrolyte lithium phosphorus oxynitride film prepared by pulsed laser deposition', Thin Solid Films 415, (2002), 108.

H. Krebs, 'Pulsed Laser Deposition of Metals', Hans-Ulrich Krebs, Chp. 16 from Pulsed Laser Deposition of Thin Films, Robert Eason Ed., John Wiley & Sons, 2007, p. 363-364.

N. Kuwata et al. 'Thin-film lithium battery with amorphous solid electrolyte fabricated by pulsed laser deposition', Electrochemistry Communications 6 (2004) p. 417-421.

Millon E. et al., 'Femtosecond pulsed-laser deposition of BaTiO3', Applied Physics A 77 p. 73-80 2003.

Nam S.C., et al., 'Reduction of Irreversibility in the First Charge of Tin Oxide Thin Film Negative Electrodes', Journal of the Electrochemical Society, 14 (3), A220, 2001.

Nuli et al., Nanocrystalline tin oxides and nickel oxide film anodes for Li-ion batteries', J Power Sources, 114, (2003), 113.

Park et al., 'Characteristics of tin nitride thin-film negative electrode for thin-film microbattery', J Power Sources 103 (1): 67-71 (2001).

D. Glöβ, et al. Photocatalytic titanium dioxide thin films prepared by reactive pulse magnetron sputtering at low temperature, Surface & Coatings Technology, 2005, pp. 967-971, vol. 200, Elsevier Ltd.

P. Frach, et al., Deposition of photocatalytic TiO2 layers by pulse magnetron sputtering and by plasma-activated evaporation, Vacuum Surface Engineering, Surface Instrumentation & Vacuum Technology, 2006, pp. 679-683, vol. 80, Elsevier Ltd.

M. Kamei, et al., Crystallized TiO2 film growth on unheated substrates by pulse-powered magnetron sputtering, Thin Solid Films, 2006, pp. 627-630, vol. 515, Elsevier B.V.

J. Musil, et al., Low-temperature sputtering of crystalline TiO2 films, J. Vac. Sci. Technol., 2006, pp. 521-528, vol. 24.

M. Matsubara, et al., Preparation of TiO2 Nanoparticles by Pulsed Laser Ablation: Ambient Pressure Dependence of Crystallization, The Japan Society of Applied Physics, 2003, pp. 479-481, No. 5A.

N. Koshizaki, et al., Preparation of nanocrystalline titania films by pulsed laser deposition at room temperature, Applied Surface Science, 2002, pp. 624-627, vol. 197-198, Elsevier Science B.V.

J. Lackner, Industrially-styled room-temperature pulsed laser deposition of titanium-based coatings, Vacuum Surface Engineering, Surface Instrumentation & Vacuum Technology, 2004, pp. 73-82, vol. 78, Elsevier Ltd.

A.V. Bulgakov, et al., Cluster emission under femtosecond laser ablation of silicon, Thin Solid Films, 2004, pp. 557-561, vol. 453-454, Elsevier B.V.

S. Eliezer, et al., Synthesis of nanoparticles with femtosecond laser pulses, Physical Review B., 2004, pp. 144119-1-144119-6, vol. 69.

S. Amoruso, et al., Generation of silicon nanoparticles via femtosecond laser ablation in vacuum, Applied Physics Letters, 2004, pp. 4502-4504, vol. 84, No. 22.

T. Sasaki, et al., Preparation of Nanoparticles by Excimer Laser Ablation of Calcium Iron Complex Oxide, AlChE Journal, 1997, pp. 2636-2640, vol. 43, No. 11A.

M. Ullmann, et al., Nanoparticle formation by laser ablation, Journal of Nanoparticle Research, 2002, pp. 499-509, vol. 4, Kluver Academic Publishers, The Netherlands.

Happy, et al., Effect of deposition parameters on morphology and size of FeCo nanoparticles synthesized by pulsed laser ablation deposition, Applied Surface Science, 2006, pp. 2806-2816, vol. 252, Elsevier B.V.

Y. Naono, et al., Classification and characterization of gold and nickel nanoparticles with a differential mobility analyzer, Science and Technology of Advanced Materials, 2006, pp. 209-215, vol. 7, Elsevier Ltd.

F. Vidal., et al., Critical-Point Phase Separation in Laser Ablation of Conductors, Physical Review Letters, 2001, pp. 2573-2576, vol. 86, No. 12.

S. Nolte, et al., Ablation of metals by ultrashort laser pulses, J. Opt. Soc. Am. B, 1997, pp. 2716-2722, vol. 14, No. 10.

(56) References Cited

OTHER PUBLICATIONS

B. Liu, et al., Nanoparticle generation in ultrafast pulsed laser ablation of nickel, Applied Physics Letters, 2007, pp. 044103-1-04103-3, vol. 90.
Basillais et al (Applied Physics A 71. 619-625 (2000).
S. Amoruso "Femtosecond laser pulse irradiation of solid targets as a general route to nanoparticle formation in a vacuum," Physical Review B, vol. 71, No. 3, Jan. 15, 2005 pp. 33406-33410.
Albert et al. (Applied Physics A 76, 319-323 (2003)).
Hendron et al (Journal of Applied Physics. vol. 81. Issue 5 (1997) pp. 2131-2134).
G. Ausanio "Production of nanoparticles of different materials by means of ultrashort laser pulses," Applied Surface Science, vol. 252, No. 13, Apr. 2006, p. 4678.
CN Application #200880001813.5 Office Action Jun. 29, 2010.
CN Application #200880001813.5 Office Action Aug. 12, 2011.
CN Application #200880001813.5 Office Action Feb. 15, 2012.
EP Application #08799669.0 Office Action dated Jan. 24, 2012.
EP Application # 08799669.0 EPO search report dated May 26, 2010.
Bailini et al., 'Pulsed laser depositon of tungsten and tungsten oxide thin films with tailored structure at the nano- and mesoscale', Applied Surface Science 253 (2007) 8130-8135.
Y. Choi et al., "Fabrication and characterization of anatase TiO2 thin film on glass substrate grown by pulsed laser deposition", Solid State Ionics 172 (2004) 105-108.
F. Ding et al., "Electrochromic Properties of ZnO Thin Films Prepared by Pulsed Laser Deposition", Electrochemical and Solid-State Letters 2 (8) 418-419 (1999).
F. Ding et al., "Tin-Based Composite Oxide Thin-Film Electrodes Prepared by Pulsed Laser Deposition", Journal of the Electrochemical Society 146 (10) 3554-3559 (1999).
L. Escobar-Alarcon et al., "Structural characterization of TiO2 thin films obtained by pulsed laser deposition", Applied Surface Science 137 (1999) 38-44.
Z. Fu et al., "Electrochemical and Electrochromic Properties of Niobium Oxide Thin Films Fabricated by Pulsed Laser Deposition", Journal of the Electrochemical Society 146 (10) 3914-3918 (1999).
M. Fusi et al., "Titanium oxide nanostructured films by reactive pulsed laser deposition", Applied Surface Science 255 (2009) 5334-5337.
N. Inoue et al., "TiO2 thin films prepared by PLD for photocatalytic applications", Applied Surface Science 197-198 (2002) 393-397.
J-H. Kim et al., "The effect of target density and its morphology on TiO2 thin films grown on Si(100) by PLD", Applied Surface Science 151 (1999) 6-16.
T. Nakamura et al., "Study on Fabrication of Titanium Oxide Films by Oxygen Pressure Controlled Pulsed Laser Deposition", Materials Transactions vol. 45, No. 7 (2004) 2068-2072.
S. Sankar et al., "Effect of annealing on the structural, electrical and optical properties of nanostructured TiO2 thin films", Cryst. Res. Technol. 44, No. 9, 989-994 (2009).
A.K. Sharma et al., "Phase transformation in room temperature pulsed laser deposited TiO2 thin films", Applied Surface Science 206 (2003) 137-148.
F. Zhengwen et al., "In situ spectroelectrochemical behaviour of nanocrystalline TiO2 thin films electrode fabricated by pulsed laser deposition", Science in China (Series B); vol. 42, No. 5, Oct. 1999.
Xi-Song Zhou et al., "Processing and characterization of TiO2 film prepared on glass via pulsed laser deposition", Journal of Physics D 39 (2006) 558-562.
E.G. Gamaly et al., Control over a phase state of the laser plume ablated by femtosecond laser, Journal of Applied Physics, vol. 95, 2250-2257 (2004).
Dai et al Preparation of Highly Crystalline TiO2 Nanostructures, Nanoscale Res Lett_2010 5:1829-1835 DOI:10.1007/s 11671-010-9720-0, Aug. 11, 2010.
Amorphous metal—Wikipedia, the free enclyclopedia.
Fu et al, In-situ Photoelectrochemistry of PLD Nano-TiO2 Film electrode, Science in China Series B, vol. 29, No. 6, pp. 546 Dec. 31, 1999.
L. Escobar-Alarcon et al., Structural characterization of TiO2 thin films obtained by pulsed laser deposition, Applied Surface Science 137 38-44 (1999).
N. Lobstein et al., Deposition by laser ablation and characterization of titanium dioxide films on polyethylene-terephthalate_Applied Surface Science 89 (Mar. 1995) 307-321.

* cited by examiner

METHOD FOR DEPOSITING CRYSTALLINE TITANIA NANOPARTICLES AND FILMS

The present application claims priority to U.S. Ser. No. 11/798,114, now abandoned, filed on 10 May 2007 which claims priority to provisional application 60/899,892, filed Feb. 7, 2007, the content of which is expressly incorporated by reference herein.

FIELD OF THE INVENTION

This invention is related to a low-temperature process of depositing nanoparticles and nanocomposite films of crystalline titanium dioxide ($TiO_2$), or other crystalline metal oxides, onto a substrate surface using ultrafast pulsed laser ablation.

DESCRIPTION OF THE PRIOR ART $TiO_2$ is a multi-functional material that has attracted extensive research and development efforts in the last two decades. New applications in energy and environmental fields are being pursued, in addition to its traditional usage as a white pigment. The new applications of $TiO_2$ include gas sensors, electrochromic devices, dye-sensitized solar cells, and photocatalysts. Various photocatalysts have been developed using $TiO_2$ and have applied to fields such as air/water purification, self-cleaning, anti-fogging (hydrophilic/hydrophobic switching), sterilization, and hydrogen production through water-splitting. Two critical properties of $TiO_2$ that determine its application are the crystal structure and surface morphology. Usually, a "nanocrystalline" structure is ideal for $TiO_2$ films to achieve high functional performance. This is because i) the high specific surface area provides superior surface activity when the particles (or grains) are of nanoscale dimensions; and ii) catalytic activity is sensitively associated with the crystallinity of individual nanoparticles, and good crystallinity (in anatase, brookite or rutile structures) is desired.

With the rapid growth and expansion of $TiO_2$ applications, there is an emerging demand for large area deposition of crystalline $TiO_2$ on substrates such as plastics, polymer films, and glasses. These substrates are unstable under heating, and it is also very difficult to heat them uniformly over a large area. A desirable deposition process is needed to permit fabrication of crystalline $TiO_2$ films below 300° C. or even without any heat treatment.

Nanoparticles and nanocrystalline films of $TiO_2$ have been conventionally produced by various techniques including "wet processes", such as sol-gel deposition, i.e., aqueous precipitation reactions followed by post-annealing treatment; and "dry processes", such as physical vapor deposition (PVD), chemical vapor deposition (CVD), and sputtering. In the physical methods, elevated temperatures above 300° C. (up to 550° C.) are normally used during deposition and/or post-annealing to realize crystalline $TiO_2$ films. In addition to the difficulties in heating, there is also a challenge for the conventional techniques to achieve desired morphologies and nanostructures while maintaining purity, stoichiometry, and homogeneity of $TiO_2$. Schichtel (U.S. Pat. No. 7,135,206) teaches a chemical (wet) process to coat $TiO_2$ nanoparticles by using oxide, hydroxide and urease/urea as the enzymatic precipitant system.

Recently, a technique of pulsed magnetron sputtering (PMS) has been employed to deposit crystalline $TiO_2$ films at room-temperature (See, "Photocatalytic titanium dioxide thin films prepared by reactive pulse magnetron sputtering at low temperature", D. Glöβ, P. Frach, O. Zywitzki, T. Modes, S. Klinkenberg, C. Gottfried, Surface Coatings Technology, 200, 967-971, 2005, and. "Deposition of photocatalytic $TiO_2$ layers by pulse magnetron sputtering and by plasma-activated evaporation", Vacuum, 80, 679-683, 2006. See also "Crystallized $TiO_2$ film growth on unheated substrates by pulse-powered magnetron sputtering", M. Kamei, T. Ishigaki, Thin Solid Films, 515, 627-630, 2006). This process nominally works without heating, however the substrate temperature is actually raised by plasma bombardment (Ref. 3). In general, a certain level of heating is necessary for making crystalline $TiO_2$. For example, J. Musil et al. reported a minimum substrate temperature of 160° C. to form crystalline $TiO_2$ films with reactive magnetron sputtering (See, "Low-temperature sputtering of crystalline $TiO_2$ films", J. Musil, D Heřman, and J. Šícha, J. Vac. Sci. Technol. A 24, p. 521, 2006).

Pulsed laser deposition (PLD), also known as pulsed laser ablation (PLA), has appeared to be another promising technique to fabricate nanoparticles and films of crystalline $TiO_2$ at low temperatures. (See, "Preparation of $TiO_2$ nanoparticles by pulsed laser ablation: ambient pressure dependence of crystallization", Jpn. J. Appl. Phys. 42, L479-481, 2003 and "Preparation of nanocrystalline titania films by pulsed laser deposition at room temperature", N. Koshizaki, A. Narazaki, T. Sasaki, Applied Surface Science, 197-198, 624-627, 2002). A particular advantage of this technique is the highly energetic plasma generated by laser ablation.

Conventional PLD/PLA methods mostly employ nanosecond pulsed lasers such as Q-switched excimer lasers and Nd:YAG lasers. The intense laser irradiation heats the material surface, and leads to surface melting and vaporization. At sufficient irradiance, the vapor can become ionized, and a plasma is formed (which is called plume). Nanocrystalline $TiO_2$ particles can then be generated through forced condensation of the ablated vapor in a high pressure (>1 Torr) background gas. In the nanosecond PLD/PLA approach, the resultant nanoparticles often have a wide size distribution ranging from a few nanometers to a few hundreds of nanometers. The major drawbacks of this technique include unavoidable formation of very large (micron-sized) droplets from the splashing of molten target and difficulty in large-area deposition.

J. M. Lackner proposed a scale-up solution for industrial use of the PLD technique in depositing Ti-base films, in which a multi-beam scheme of high power Nd:YAG laser light was used to coat the films at room temperature. (See, "Industrially-styled room temperature pulsed laser deposition of titanium-based coatings", J. M. Lackner, Vacuum, 78, 73-82, 2005). However, the controllability of the crystallinity of $TiO_2$ is still a challenge.

A few PLD/PLA related prior patents include: JP 2002-206164, which discloses a double-beam method in nanosecond PLD to deposit crystalline $TiO_2$ film at elevated temperatures (>600° C.); JP 2002-20199, which discloses a nanosecond PLD to grow epitaxial rutile-$TiO_2$ films; and JP 2004-256859, which discloses a PLD method to produce amorphous $TiO_2$ nanoparticles.

With the commercial availability of ultrafast pulsed lasers with typical pulse durations ranging from a few femtoseconds to tens of picoseconds, ultrafast PLA/PLD has attracted much attention. Due to the extremely short pulse duration and the resultant high peak power density, the ablation threshold is reduced by 1-2 orders of magnitude compared with nanosecond PLA, and as a result, the commonly favored ultraviolet wavelength (which is expensive to obtain) in nanosecond PLA is no longer a requirement in ultrafast PLA. A prior patent (U.S. RE 37,585) provides a guideline to realize efficient laser ablation by selecting appropriate pulse duration and taking advantage of the low ablation thresholds.

A few theoretical and experimental studies have suggested that ultrafast PLA also generates nanoparticles, but with a fundamentally different mechanism from those processes using longer (nanosecond) pulses. (See, A. V. Bulgakov, I. Ozerov, and W. Marine, Thin Solid Films 453, p. 557, 2004, and S. Eliezer, N. Eliaz, E. Grossman, D. Fisher, I. Couzman, Z. Henis, S. Pecker, Y. Horovitz, M. Fraenkel, S. Maman, and Y. Lereah, Physical Review B, 69, p. 144119, 2004. See also, S. Amoruso, R. Bruzzese, N. Spinelli, R. Velotta, M. Vitiello, X. Wang, G. Ausanio, V. Iannotti, and Lanotte, Applied Physics Letters, 84, No. 22, p. 4502, 2004). In ultrafast PLA, nanoparticles are generated automatically as a result of phase transition near the critical point of the material under irradiation, which is only reachable through ultrafast heating. Also, unlike the forced condensation/nucleation process in nanosecond PLA, which occurs long after the ablation is over, the nanoparticle generation in ultrafast pulsed laser ablation takes place at a very early stage during ablation (less than one nanosecond after the laser pulse hits the target), and the energetic nanoparticles fly out in a very directional manner. These features in principle should enable a one-step process that can cover both the particle generation and deposition. Thus, both nanoparticles and nanocomposite films, i.e., nanoparticle-assembled films can be deposited onto substrates with good adhesion (due to the kinetic energy of the particles) by using the ultrafast PLA method.

Based on the inventors' previous systematic investigation, a patent application (U.S. Provisional Application 60/818, 289, incorporated by reference herein) and a publication were disclosed recently, in which the experimental parameters for size selection and crystallinity control (at room temperature) were described for nanoparticle generation using an ultrafast PLA process. (See, B. Liu, Z. Hu, Y. Chen, X. Pan, and Y. Che, Applied Physics Letters, 90, p. 044103, 2007). The present invention is an application of the above process specifically used for metal oxides, such as $TiO_2$, and provides a one-step process to deposit nanoparticles and nanocomposite (nanoparticle-assembled) films of crystalline $TiO_2$ and other metal oxides at room-temperature.

All patent applications, patents and publications referred to above are expressly incorporated by reference herein, and particularly, the following patent documents disclosing related subject matter as referenced above are incorporated by reference herein: U.S. RE 37,585 to Mourou et al.; JP 2002-206164 to Sasaki et al.; JP 2002-20199 to Yamaki et al.; JP 2004-256859 to Sai et al.; 60/818,289 to Liu et al.; and U.S. Pat. No. 7,135,206 to Schichtel.

SUMMARY OF THE INVENTION

One aspect of the present invention is an application of the above process specifically used for metal oxides, such as $TiO_2$, and provides a one-step process to deposit nanoparticles and nanocomposite (nanoparticle-assembled) films of crystalline $TiO_2$ and other crystalline metal oxides at room-temperature.

This invention relates in part to producing nanoparticles and nanocomposite films of crystalline $TiO_2$ by using ultrafast pulsed laser ablation (PLA). Instead of heating up the substrate during deposition or post-annealing after deposition, the crystalline $TiO_2$ is realized at room temperature. This room-temperature process, which benefits from the ultrafast PLA as described in the last section, enables coating of functional $TiO_2$ particles or films onto heat-sensitive materials such as glasses, plastics, papers, and polymer films.

The nanoparticles or the grains of nanocomposite films have particle/grain size ranges from a few nanometers up to one micron. The particle/grain size is controllable mainly by selecting an appropriate laser fluence (see, U.S. 60/818,289).

The nanocomposite $TiO_2$ films can be nanoparticle-assembled films produced by continuous deposition of $TiO_2$ nanoparticles; or can be a composite with a host film embedded with nanoparticles of crystalline $TiO_2$. The host film can be of titanium oxides ($TiO_x$) in either crystalline or amorphous forms. It can also be any other host material such as ceramics or polymers. The nanocomposite films can be produced by alternately or simultaneously depositing the host material and crystalline $TiO_2$ nanoparticles. A variety of material combinations can be easily realized by alternating targets of different materials inside the deposition chamber.

$TiO_2$ has three major crystalline structures, including rutile, anatase, and brookite. Rutile is known as the thermally stable (high temperature) phase produced normally under a temperature higher than 500° C.; and anatase and brookite are metastable (low temperature) phases which can be transformed to rutile under high temperature. It is known that anatase usually exhibits better photocatalytic activities. However in some applications, rutile is preferred due to its slightly narrower band gap of 3.0 eV (compared to 3.2 eV for anatase), and higher dielectric constant. In the ultrafast PLA process, the crystal structures of $TiO_2$ are no longer determined by the temperature of the substrate or the annealing process. They are mainly controlled by laser parameters, such as laser fluence (or pulse energy), pulse width, repetition rate, and wavelength. For the present embodiment, anatase and rutile or their mixtures are preferred; and a pulse width of 10 fs-100 ps, a laser fluence of 10 $mJ/cm^2$-100 $J/cm^2$ (pulse energy of 100 nJ-10 mJ), and a repetition rate of 1 kHz-100 MHz are preferred. Because laser fluence is a critical parameter in ultrafast PLA, this invention also employs an optical setup to transform the laser beam from a Gaussian profile to a "flat-top" profile to realize a uniform fluence on the target surface.

In addition to the above laser parameters, the background gas(es) and their pressures also provide additional control over the crystallinity, stoichiometry, and the morphology of particles and films. In the ultrafast PLA process, desired crystallinity, stoichiometry, and the morphology of $TiO_2$ can be realized either by ablating a titanium oxide ($TiO_x$) target or metal titanium target in a background gas of oxygen or a gas mixture containing oxygen with appropriate partial and total pressures.

BRIEF DESCRIPTION OF THE DRAWINGS

FIG. 5D is a high resolution TEM image of a sample deposited on TEM grid. The sample was produced by ablating a titanium oxide target in vacuum at a fluence of 0.2 J/cm$^2$. The lattice fringes in the image are <101> planes of a brookite crystal and the crystal was viewed down in its [010] direction, and.

DETAILED DESCRIPTION OF THE PREFERRED EMBODIMENTS

The present invention provides a one-step room-temperature process for depositing nanoparticles and nanocomposite (i.e., nanoparticle-assembled) films of crystalline metal oxides including crystalline titanium dioxide (TiO$_2$) onto a substrate surface using ultrafast pulsed laser ablation of source-metal targets such as titania or metal titanium targets in the case of TiO$_2$.

Figure 1:
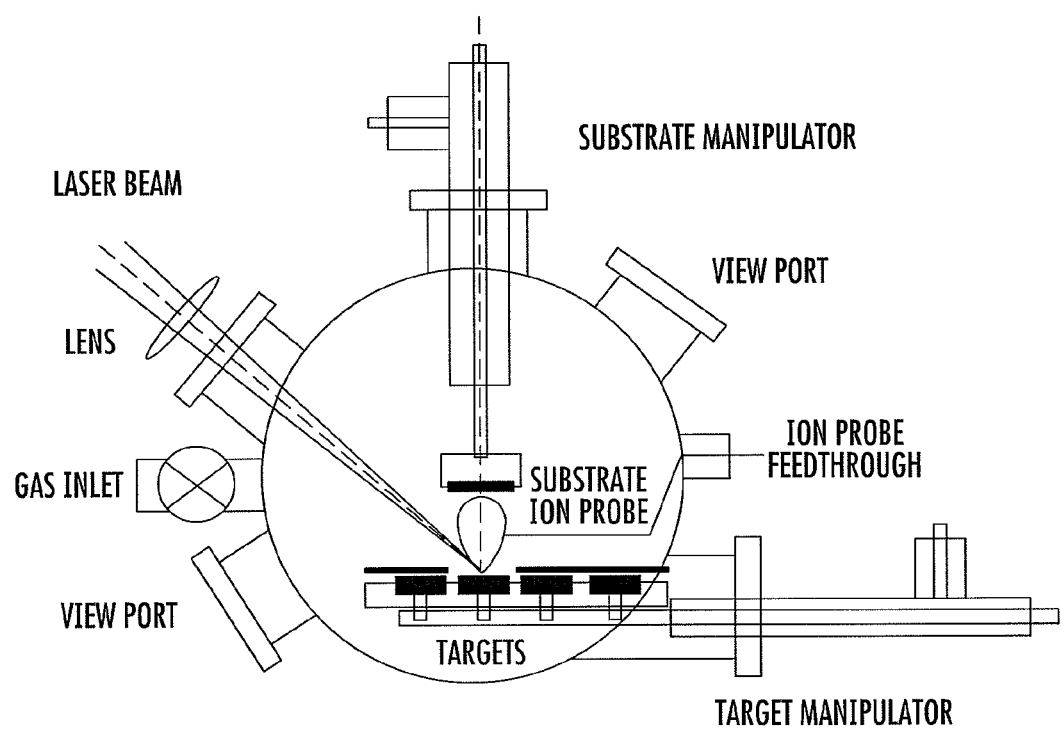
FIG. 1 illustrates the set up of the pulsed laser deposition system. The system includes a vacuum chamber (and related pumps, not shown in the figure), a target manipulator, an ion probe (Langmuir probe), a gas inlet, and a substrate manipulator. The laser beam is focused onto the target surface through a fused silica window.

FIG. 1 illustrates the experimental system used in this invention. The system includes a vacuum chamber pumped by a turbo pump and a mechanical pump, a target manipulator which provides rotational and lateral movements for four targets of different materials, a substrate manipulator which provides heating and rotational and lateral movements for the substrate, a gas inlet through which reactive gases are provided and their pressures are appropriately adjusted, and an ion probe (Langmuir probe) to measure the ion current of the ablation plume, which is used as an indicator for focusing the laser beam on the target surface. When measuring the ion current, the ion probe is biased −50 V relative to ground to collect the positive ions in the plume (the number of negative ions in plasma is negligible). An ultrafast laser (not shown in the figure) is positioned outside the chamber and the laser beam is focused onto the target surface through a fused silica window. The laser has a pulse width between 10 fs-50 ps, preferably between 10 fs-1 ps; a pulse energy between 100 nJ-10 mJ; and a repetition rate greater than 1 kHz. Particularly, a femtosecond pulsed fiber laser system (FCPA μJewel D-400, IMRA America, Inc., which emits a laser beam of pulses with pulse duration in the range of 200-500 fs, a wavelength of 1045 nm and a repetition rate between 100 kHz and 5 MHz) was used in this study.

The system also includes an optical setup for processing the laser beam such that the beam is focused onto the target surface with an appropriate average energy density and an appropriate energy density distribution.

The targets used in this embodiment are round disks of titanium metal and compressed TiO$_2$ powder. The packing density of the target is expected to be as high as possible (at least >50% of its theoretical density). The shape of the target is not limited to a round disk. It can be square or a rectangular pellet, or of arbitrary shape. However, the target needs to have at least one smooth surface for laser ablation.

Titanium metal and titanium oxide TiO$_2$ are used as example materials in this embodiment, but this embodiment is not limited to these materials, because the physics and chemistry behind crystalline titania formation during ultrafast pulsed laser ablation applies similarly to other compounds containing elemental titanium, as long as the material contains elemental titanium that can react with oxygen during laser ablation to form TiO$_2$.

In this invention, an ultrafast pulsed laser beam is focused onto a target. A plume of plasma (containing ions, neutrals, and small particles) is emitted and collected by a substrate to form the film. The substrate can be made of any material sustainable in a vacuum. This is because the film deposition is processed at the ambient (room) temperature and there is no substrate heating requirement in this invention.

Figure 2A:
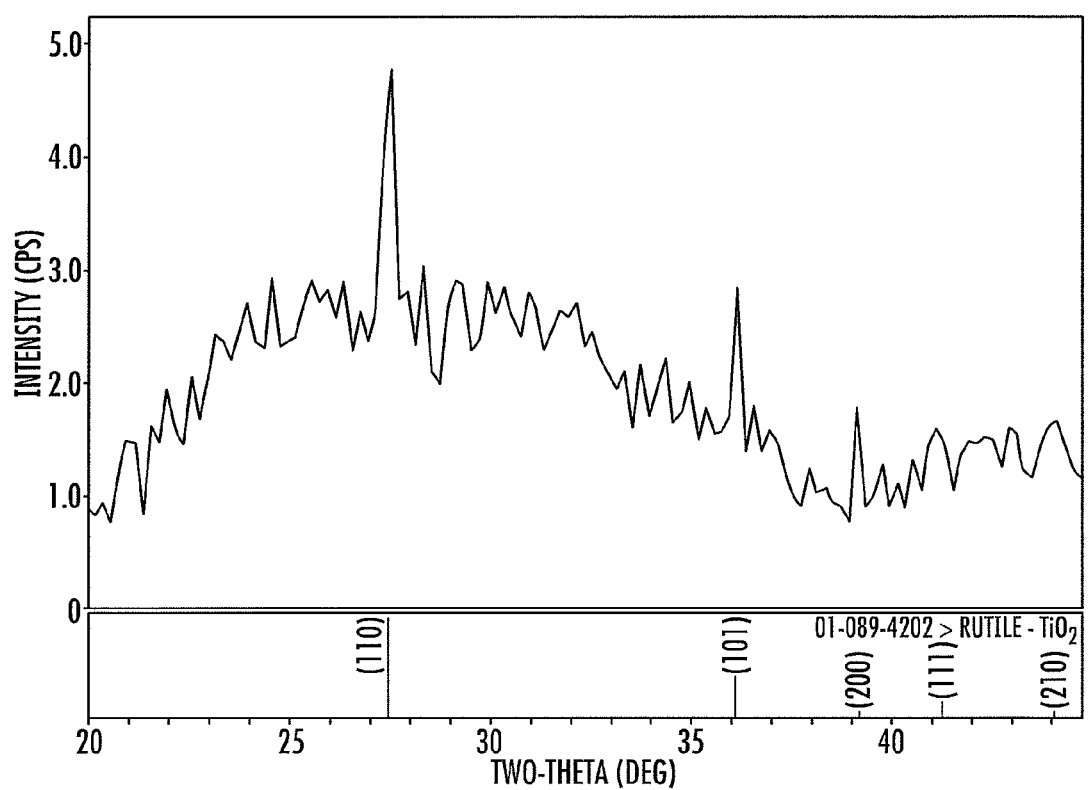
FIG. 2A shows the X-ray diffraction pattern of a sample deposited on a glass substrate. The sample was produced by ablating a titanium oxide target in vacuum with a laser fluence of 0.4 $J/cm^2$.
Figure 2B:
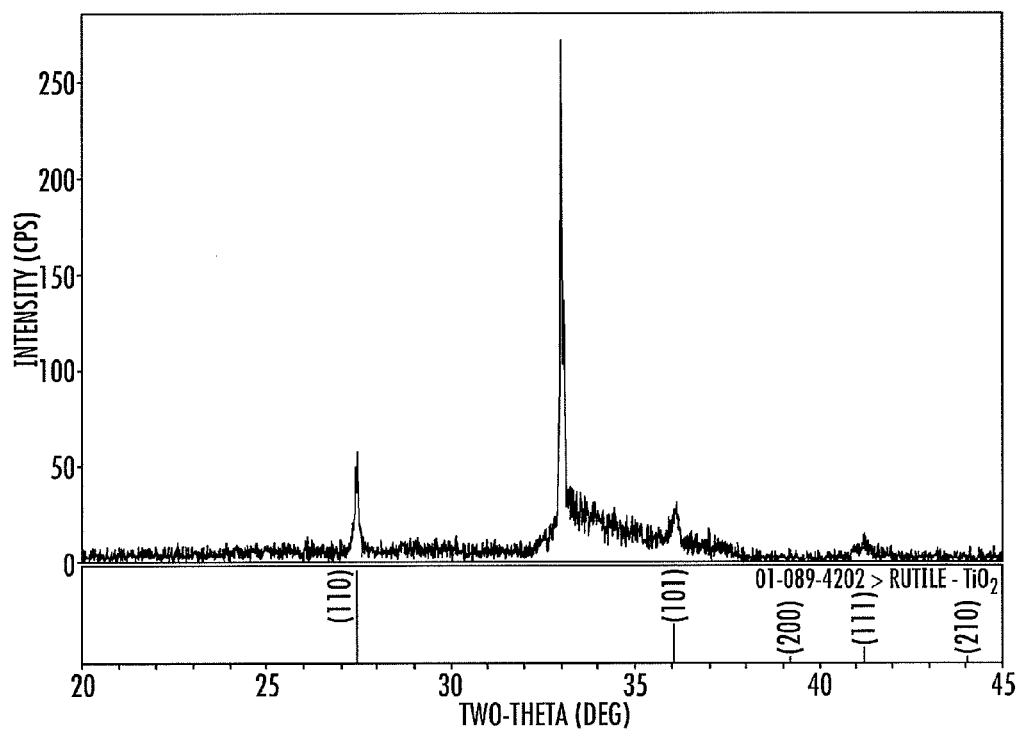
FIG. 2B shows the X-ray diffraction pattern of a sample deposited on a silicon wafer (100). The sample was produced by ablating a titanium oxide target in vacuum with a laser fluence of 0.4 $J/cm^2$.
Figure 2C:
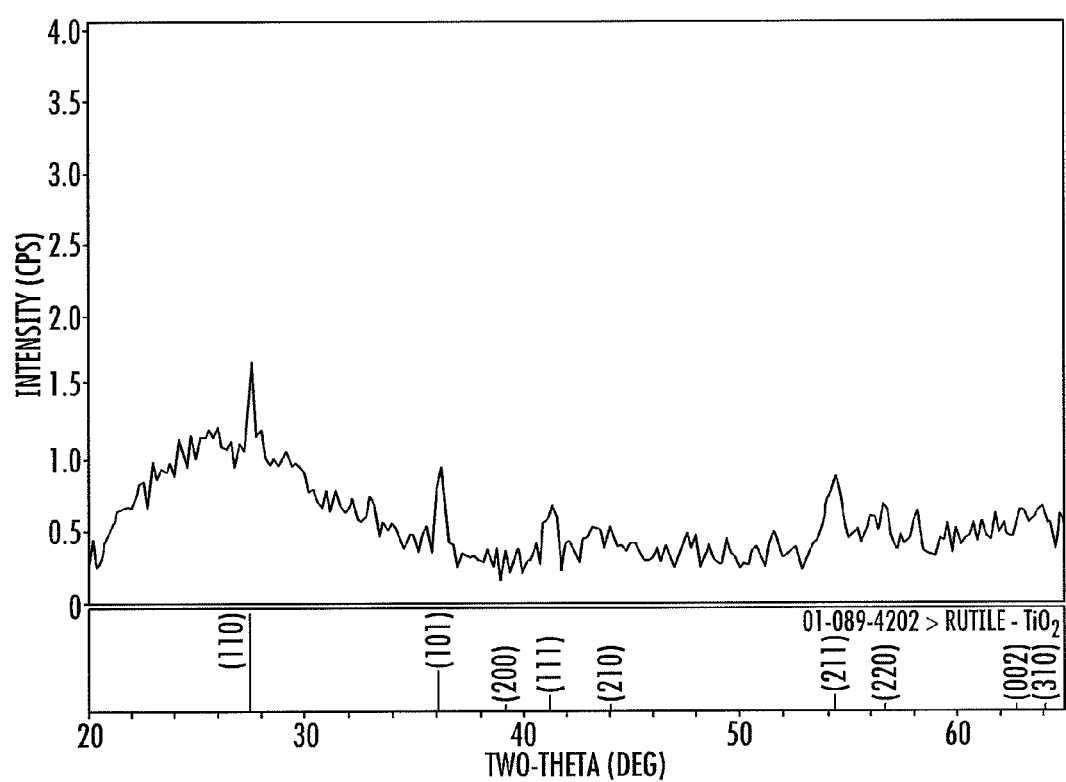
FIG. 2C shows the X-ray diffraction pattern of a sample deposited on a glass substrate. The sample was produced by ablating a titanium metal target under 100 Pa of oxygen with a laser fluence of 0.3 J/cm$^2$.

FIGS. 2A-2C display the X-ray diffraction (XRD) θ-2θ patterns of the titania films deposited on glass and silicon substrates under various conditions. The standard powder XRD pattern of rutile (from the Powder Diffraction File published by the International Center for Diffraction Data) is also indicated in the lower half of each figure. The XRD results of FIG. 2A and FIG. 2C are recorded with a Rigaku MiniFlex X-Ray Diffractometer. The XRD pattern in FIG. 2B is recorded with a Rigaku Rotoflex Diffractometer that has a higher X-ray intensity and a better signal to noise ratio on the diffraction patterns. In particular, FIG. 2A shows the XRD result of the crystalline structure of a sample deposited on a glass substrate by ablating a titanium oxide target in vacuum with a laser fluence of 0.4 J/cm$^2$. The X-ray diffraction pattern of the sample in FIG. 2A possess several diffraction peaks which correspond to the rutile phase. FIG. 2B shows the XRD result of the crystalline structure of a sample deposited on a single crystal silicon (100) substrate by ablating a titanium oxide target in vacuum with a laser fluence of 0.4 J/cm$^2$. This XRD pattern possesses several diffraction peaks which correspond to the rutile phase. The strongest peak (at 2θ=33°) comes from the silicon substrate. FIG. 2C shows the XRD result of the crystalline structure of a sample deposited on a glass substrate by ablating a titanium metal target under an oxygen pressure of 100 Pa with a laser fluence of 0.3 J/cm$^2$. This XRD patterns also correspond to the rutile phase. This suggests that the ablated titanium metal reacts with oxygen to form titanium oxide. It is worth noting that only the rutile phase is exhibited in the above XRD results.

Figure 3:
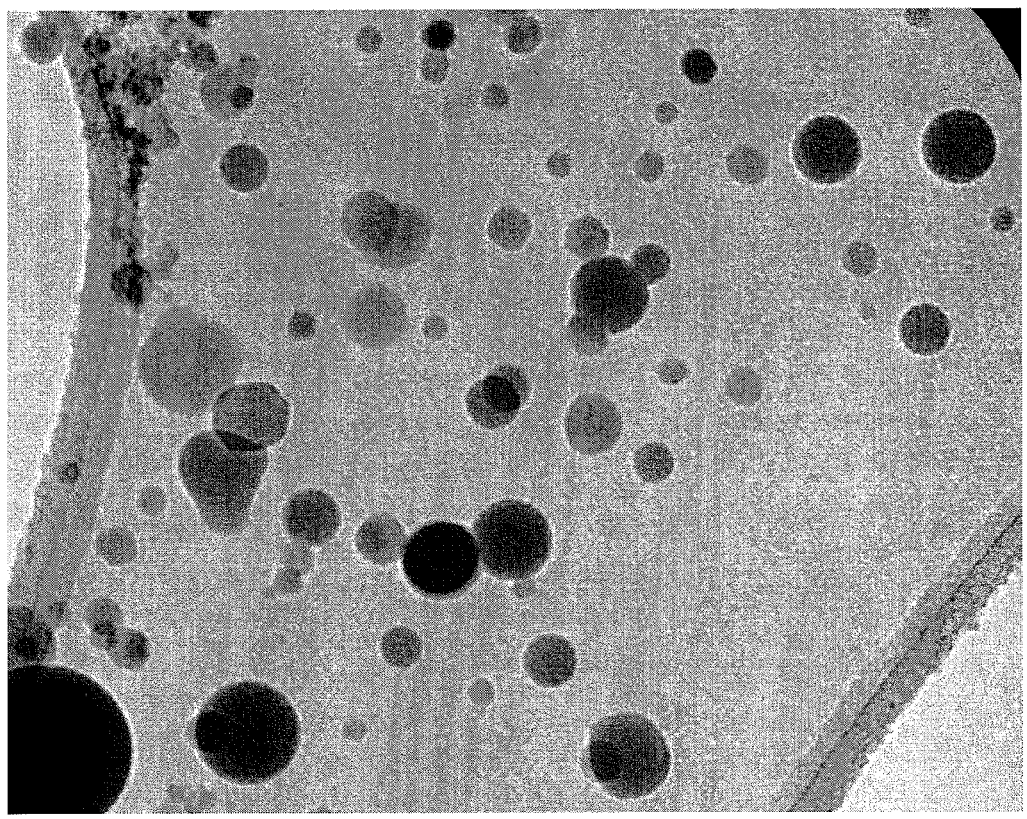
FIG. 3 is a transmission electron microscopy TEM) image of a sample deposited on a TEM grid. The sample was produced by ablating a titanium metal target under 100 Pa of oxygen with a laser fluence of 0.4 J/cm$^2$.
Figure 4:
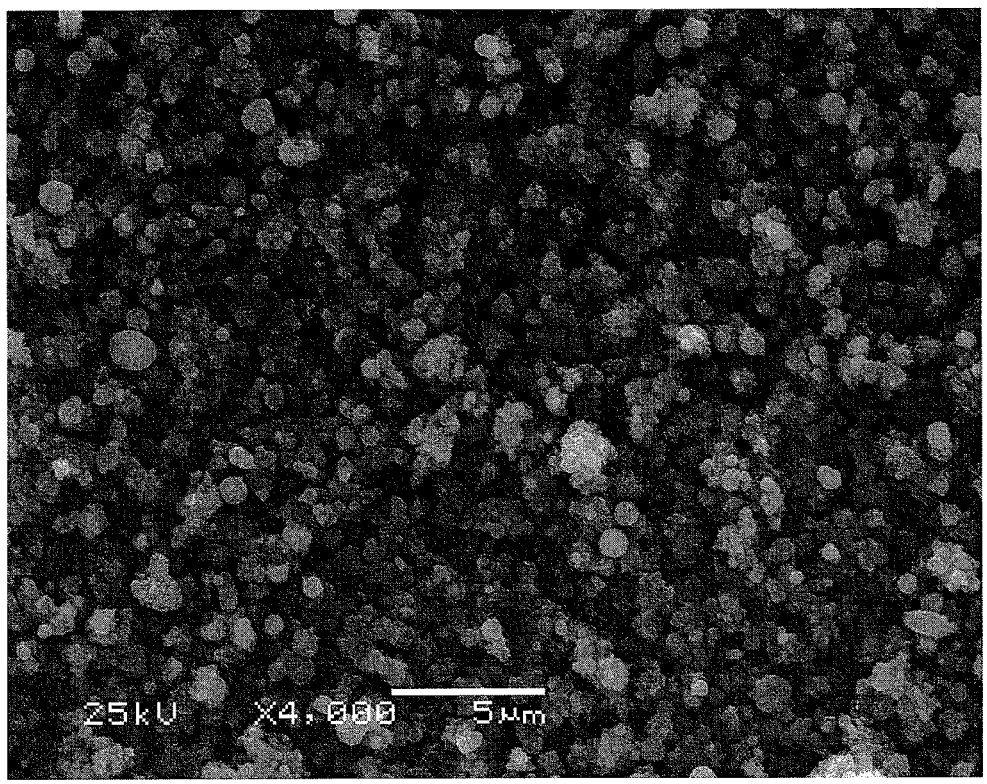
FIG. 4 is a scanning electron microscopy (SEM) image of a sample deposited on a silicon (100) wafer. The sample was produced by ablating a titanium oxide target under 0.1 Pascal of oxygen with a laser fluence of 0.4 J/cm$^2$.

The morphologies of the deposited titania were analyzed using SEM and TEM. FIG. 3 displays an SEM image of a film deposited on a silicon substrate by ablating a titanium oxide target under 0.1 Pa of oxygen. It is evident that this film is mostly composed of small particles with sizes less than one micrometer. The larger particles are aggregates of the smaller nanoparticles. The TEM image in FIG. 4 further confirms this observation, which shows the particle size is less than 100 nanometers. (The sample for FIG. 4 was deposited on a TEM grid by ablating a titanium metal target under an oxygen pressure of 100 Pa with a laser fluence of 0.4 J/cm².)

Figure 5A:
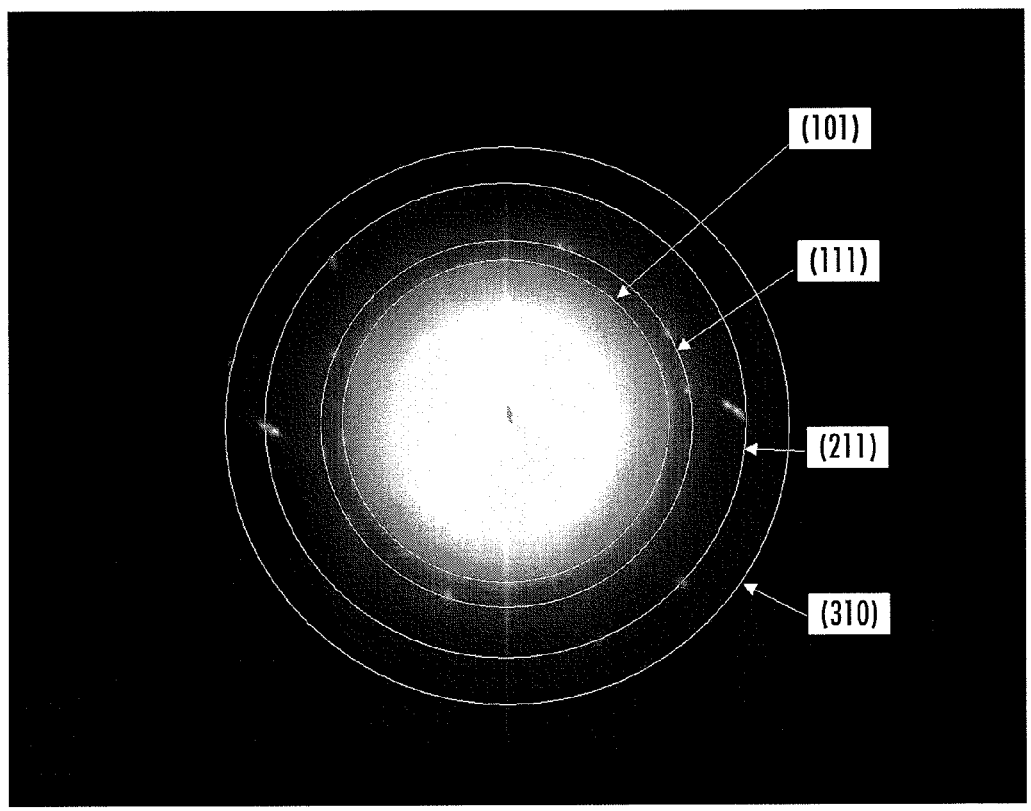
FIG. 5A shows the selected area electron diffraction (SAED) pattern of a sample deposited on a TEM grid. The sample was produced by ablating a titanium oxide target under 1.0 Pascal of oxygen with a laser fluence of 0.6 J/cm$^2$. The pattern suggests the rutile structure.
Figure 5B:
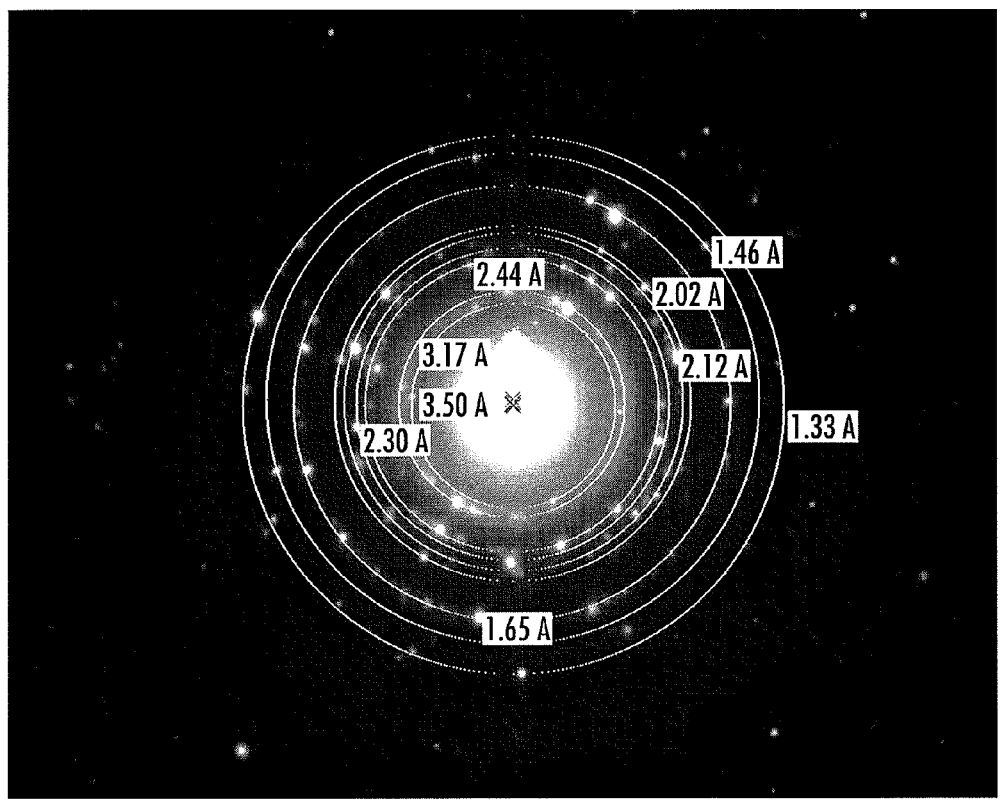
FIG. 5B shows the SAED pattern of a sample deposited on a TEM grid. The sample was produced by ablating a titanium metal target under 100 Pa of oxygen at a laser fluence of 0.4 J/cm$^2$. The pattern suggests the existence of both the rutile and anatase structures.
Figure 5C:
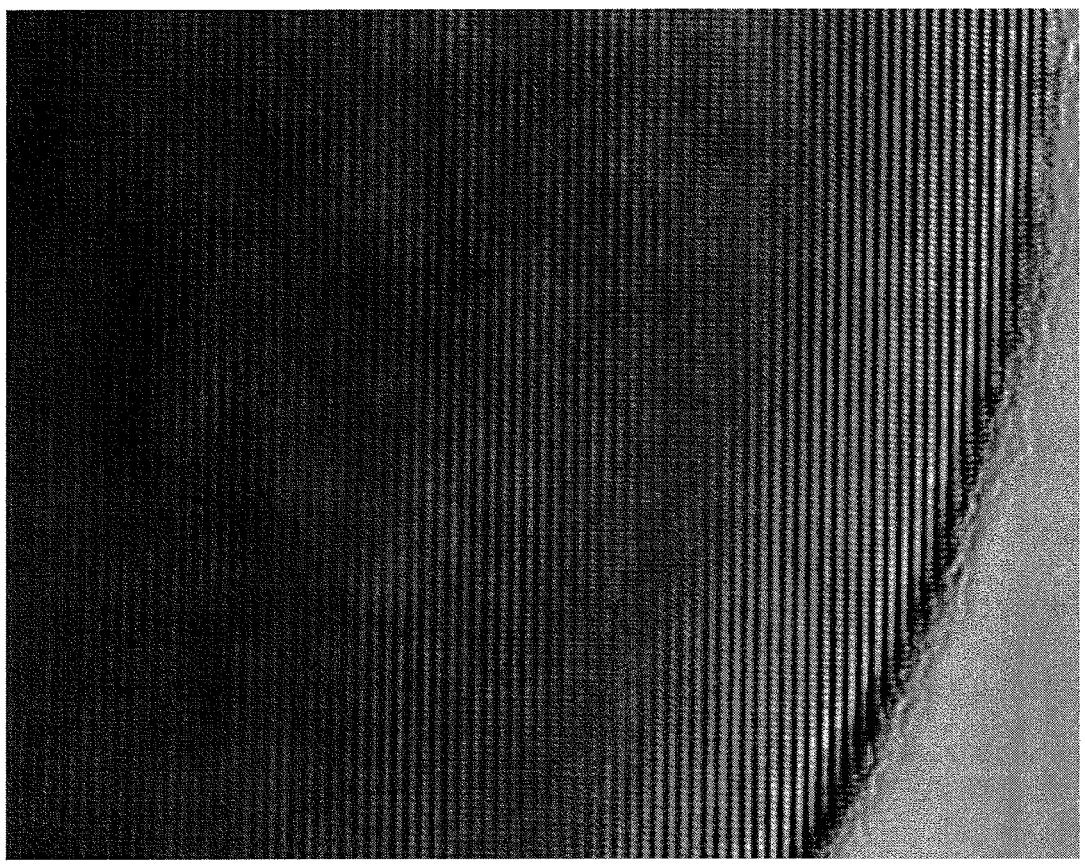
FIG. 5C is a high resolution TEM image of a sample deposited on a TEM grid. The sample was produced by ablating a titanium oxide target under 300 Pa of oxygen with a laser fluence of 0.4 J/cm$^2$. The crystal was viewed with the electron beam aligned to its direction. Clear lattice fringes are evident, indicating good (single) crystallinity of the particle.
Figure 5D:
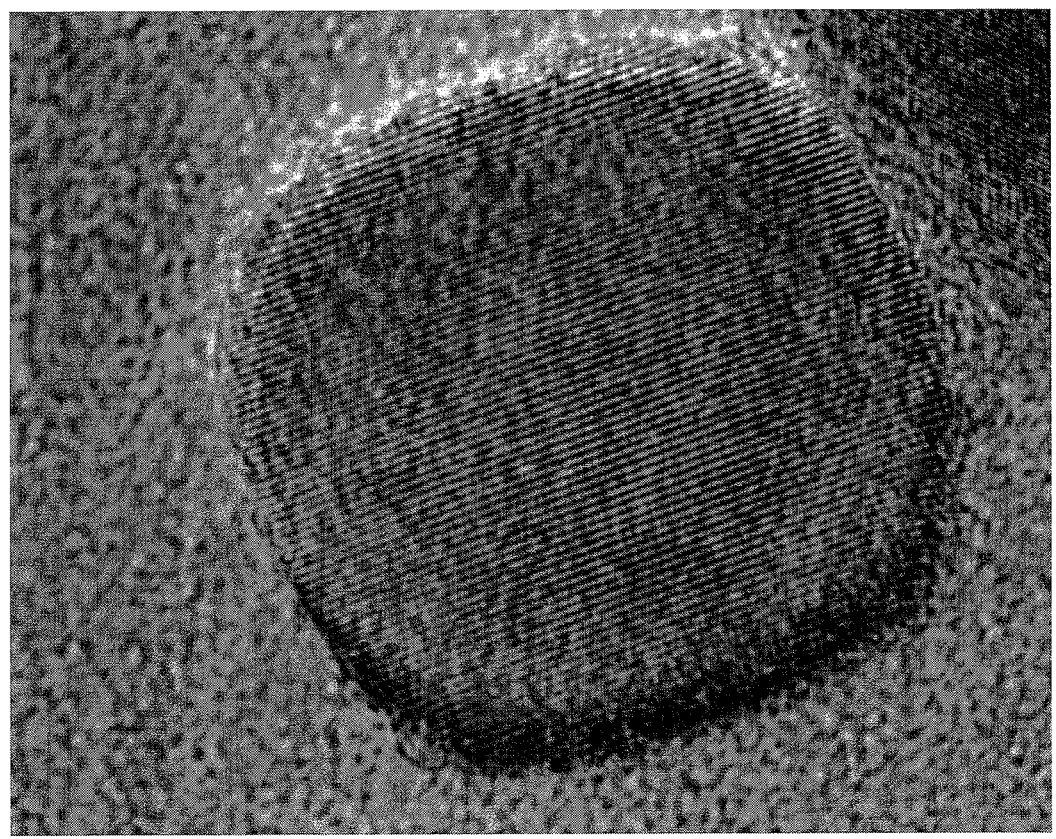

Select Area Electron Diffraction (SAED) is used to analyze in more detail the crystal structure of the deposited titania particles. FIGS. 5A and 5B display the SAED patterns of two samples deposited on TEM grids. The SAED pattern in FIG. 5A can be indexed to the rutile structure. The SAED patterns in FIG. 5B show the coexistence of rutile and anatase phases. The lattice fringes in the high resolution TEM (HRTEM) image (FIG. 5C) are obtained by an electron beam aligned to the $TiO_2$ [001] direction, and the lattice fringes in the HRTEM image (FIG. 5D) are obtained by an electron beam aligned to the brookite $TiO_2$ [010] direction. The well parallel fringes indicate a single crystalline particle.

The disclosures of U.S. Provisional application 60/818,289, and corresponding non-provisional application Ser. No. 11/712,924, are hereby incorporated by reference in their entirety. Pulsed laser deposition of other metal oxides were investigated, for size selection and crystallinity control at room temperature. In particular, Ni nanoparticles were produced.

When the background gas is reactive, for example oxygen, there are additional benefits that can help to bring in new chemical and structural properties. For example, the ablated metal can react with oxygen to form metal oxide nanoparticles. By simply exposing the metal particles to oxygen after ablation, nanoparticles with oxide shell and metal core structures can also be formed.

Figure 6:
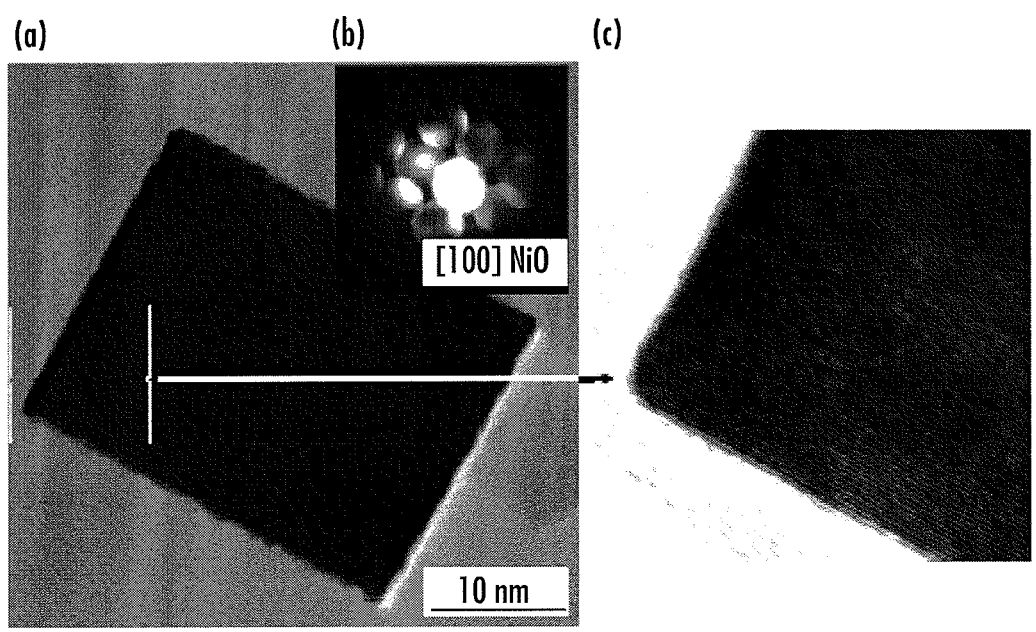
FIG. 6. Illustrates HRTEM images of a NiO nanoparticle obtained in 30 millitorr oxygen by ultrafast laser ablation of a metal Ni target. (a) and (c) are high resolution images which show the single crystal structures. (b) is a nanoelectron beam diffraction pattern which shows the NiO(100) diffraction.

FIG. 6 shows HRTEM images of a Ni nanoparticle obtained by ultrafast pulsed laser ablation in 30 millitorr oxygen. It is evident that single crystal cubic NiO nanoparticles are formed, as clearly seen FIG. 6(c). This is also confirmed by electron beam diffraction in FIG. 6(b), which displays the NiO(100) diffraction.

In various embodiments of the present invention ultrafast pulse laser deposition may also be utilized to deposit nanoparticles or nanocomposite films of crystalline metal oxides other than titanium oxide. For example, at least nickel oxides, zinc oxides, tin oxides, cobalt oxides, and/or copper oxides may be deposited on a substrate, either alone or in combination. As noted previously, the substrate may have considerable thermal sensitivity, yet remain cool during the process as a result of the use of ultrafast pulses.

As shown from the foregoing examples with Titanium Oxide a laser fluence in the range of about 0.2 J/cm2 to 0.6 J/cm2 provided good results. In some embodiments a preferred fluence range may be about 0.01 J/cm2 to 2 J/cm2.

Although a few exemplary embodiments of the present invention have been shown and described, the present invention is not limited to the described exemplary embodiments. Instead, it will be appreciated by those skilled in the art that changes may be made to these exemplary embodiments without departing from the principles and spirit of the invention, the scope of which is defined by the claimed elements and their equivalents.

We claim:

1. A method for depositing nanoparticles of crystalline $TiO_2$ or nanocomposite films of crystalline $TiO_2$, comprising:
providing a target comprised of a titanium-containing material;
providing a substrate to support the deposited nanoparticles of crystalline $TiO_2$ or films of crystalline $TiO_2$;
ablating regions of said target with ultrafast laser pulses, wherein an ultrafast pulse width is in the range of about 10 fs to 100 ps, and a fluence of an ultrafast pulse at a surface of said target is in the range of about 0.01 J/cm² to 2 J/cm², to create a plume of particles directed toward said substrate, and
depositing said nanoparticles of crystalline $TiO_2$ or nanocomposite films of crystalline $TiO_2$ onto said substrate, wherein said depositing step is performed in the absence of substrate heating, at approximately room temperature, and at a background pressure of about 100 Pa or less,
wherein, at said room temperature and at said background pressure of about 100 Pa or less, said method can produce functional nanoparticles or functional nanocomposite films of crystalline $TiO_2$ which exhibit a thermally stable rutile phase subsequent to deposition at said temperature and said background pressure.

2. The method of claim 1, wherein said substrate comprises a heat sensitive material, and said step of ablating produces a temperature at the substrate sufficiently low to substantially avoid thermal induced alteration of a substrate property, such that a functional film is formable on the heat sensitive material.

3. The method of claim 1, wherein said nanoparticles of crystalline $TiO_2$ have sizes of less than 1 micron.

4. The method of claim 1, wherein said nanocomposite films are films assembled of nanoparticles of crystalline $TiO_2$.

5. The method of claim 1, wherein said nanocomposite films are composed of a host material embedded with nanoparticles of crystalline $TiO_2$.

6. The method of claim 1, wherein said target includes elemental titanium, and said ablation takes place in an oxygenated atmosphere so that said crystalline $TiO_2$ is formed subsequent to said ablation.

7. The method of claim 1, further comprising the steps of:
providing a vacuum chamber containing said target and said substrate, and wherein said ablation step comprises irradiating the target with a laser beam generated by an ultrafast pulsed laser, the said laser beam being processed and focused onto the target by an optical system.

8. The method of claim 1 or 7, wherein said substrate is a heat sensitive material, including one of glass, paper, plastic and polymer.

9. The method of claim 7, wherein the ultrafast pulsed laser has a repetition rate of 1 kHz-100 MHz.

10. The method of claim 7, wherein the optical system processes the intensity distribution of the laser beam from a Gaussian profile to a 'flat-top' profile.

11. The method of claim 1 or 7, wherein said target includes titanium oxide and deposition onto said substrate takes place in vacuum or in background gas(es) containing oxygen.

12. The method of claim 7, wherein said target includes elemental titanium and the step of performing laser ablation takes place within background gas(es) containing oxygen.

13. The method of claim 1, wherein said nanoparticles of crystalline $TiO_2$ have sizes less than 1 μm.

14. The method of claim 1, wherein said nanocomposite films are assembled from nanoparticles of crystalline $TiO_2$.

15. The method of claim 1, wherein said substrate comprises silicon, said target material comprises titanium oxide, and wherein said target material is ablated with background gas pressure equal to about 0.1 Pa, wherein particles within said crystalline film comprise sizes less than about 1 μm.

16. The method of claim 1, wherein said substrate comprises glass, said target material comprises titanium metal, and wherein said target material is ablated with background gas pressure equal to about 100 Pa, and particles within said crystalline film comprise sizes less than about 1 µm.

17. The method of claim 1, wherein crystallinity of said nanoparticles of crystalline $TiO_2$ or nanocomposite films of crystalline $TiO_2$ formed at room temperature is characterized by having one or more referenced peaks in an X-ray diffraction (XRD) pattern or electron diffraction pattern.

18. The method of claim 1, wherein said functional nanoparticles or films are characterized by having catalytic activity associated with the crystallinity of individual nanoparticles.

19. The method of claim 1, wherein said functional nanoparticles or films produced with said method form a portion of a photocatalyst.

20. The method of claim 1, wherein said functional nanoparticles or films produced with said method are configured as a portion of a gas sensor, an electrochromic device, a solar cell, and/or a photocatalyst.

21. The method of claim 1, wherein said method produces functional nanoparticles of $TiO_2$ or functional films of $TiO_2$ characterized by having a mixture of primarily said thermally stable rutile crystalline phase, together with an anatase phase, and/or a brookite phase.

22. The method of claim 1, wherein said thermally stable rutile phase is exhibited as a rutile only phase.

23. The method of claim 22, wherein said rutile only phase is characterized by having one or more referenced peaks in an X-ray diffraction (XRD) pattern or electron diffraction pattern.

\* \* \* \* \*